(12) United States Patent
Yoshida

(10) Patent No.: US 9,787,927 B2
(45) Date of Patent: Oct. 10, 2017

(54) SOLID-STATE IMAGING APPARATUS

(71) Applicant: CANON KABUSHIKI KAISHA, Tokyo (JP)

(72) Inventor: Daisuke Yoshida, Ebina (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 14/733,157

(22) Filed: Jun. 8, 2015

(65) Prior Publication Data

US 2015/0365616 A1    Dec. 17, 2015

(30) Foreign Application Priority Data

Jun. 16, 2014   (JP) ................................ 2014-123113

(51) Int. Cl.
*H03M 1/12*    (2006.01)
*H04N 5/378*   (2011.01)

(52) U.S. Cl.
CPC ............ *H04N 5/378* (2013.01); *H03M 1/129* (2013.01)

(58) Field of Classification Search
None
See application file for complete search history.

(56) References Cited

U.S. PATENT DOCUMENTS

| 8,400,546 B2 | 3/2013 | Itano et al. |
| 8,698,062 B2 | 4/2014 | Yoshida |
| 9,159,750 B2 | 10/2015 | Ikeda et al. |
| 2011/0241918 A1* | 10/2011 | Egawa .................. H03M 1/164 341/122 |
| 2012/0261552 A1* | 10/2012 | Ikeda ..................... H04N 5/378 250/208.1 |
| 2013/0341489 A1 | 12/2013 | Yoshida |
| 2015/0237315 A1 | 8/2015 | Totsuka et al. |

FOREIGN PATENT DOCUMENTS

WO    2010109815 A1    9/2010

OTHER PUBLICATIONS

U.S. Appl. No. 14/622,604, filed Mar. 19, 2015, Daisuke Yoshida.
U.S. Appl. No. 14/665,137, filed Mar. 23, 2015, Takashi Muto.
U.S. Appl. No. 14/691,916, filed Apr. 21, 2015, Diasuke Yoshida.

* cited by examiner

*Primary Examiner* — Mark T Monk
(74) *Attorney, Agent, or Firm* — Fitzpatrick, Cella, Harper & Scinto

(57) ABSTRACT

A solid-state imaging apparatus of this invention includes an output unit that outputs an analog signal, and an offset addition unit that, in a case where the analog signal is out of a range in which A/D conversion is possible in the A/D conversion unit, adds an offset to the analog signal in the output unit so that the analog signal is not out of the range in which A/D conversion is possible.

11 Claims, 15 Drawing Sheets

US 9,787,927 B2

SOLID-STATE IMAGING APPARATUS

BACKGROUND OF THE INVENTION

Field of the Invention

The present invention relates to a solid-state imaging apparatus.

Description of the Related Art

International Publication No. WO 10/109815 discloses a solid-state imaging apparatus that includes a column amplifier that amplifies pixel signals, and a plurality of successive comparison capacitor units that output signals having different levels corresponding to respective bits of data to be subjected to A/D conversion to the column amplifier.

SUMMARY OF THE INVENTION

In the aforementioned related art, there is a problem that, if a pixel signal is large, the pixel signal at the output of the column amplifier will exceed an input upper limit or lower limit of an A/D converter, and the dynamic range of the pixel signal will therefore decrease.

A solid-state imaging apparatus according to the present invention includes: an output unit that outputs an analog signal; an A/D conversion unit that converts the analog signal to a digital signal; and an offset addition unit that, in a case where the analog signal is out of a range in which A/D conversion is possible in the A/D conversion unit, adds an offset to the analog signal in the output unit that is according to a size of the analog signal so that the analog signal falls within the range.

According to the present invention, an advantageous effect of preventing a decrease in the dynamic range of an analog signal is obtained.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
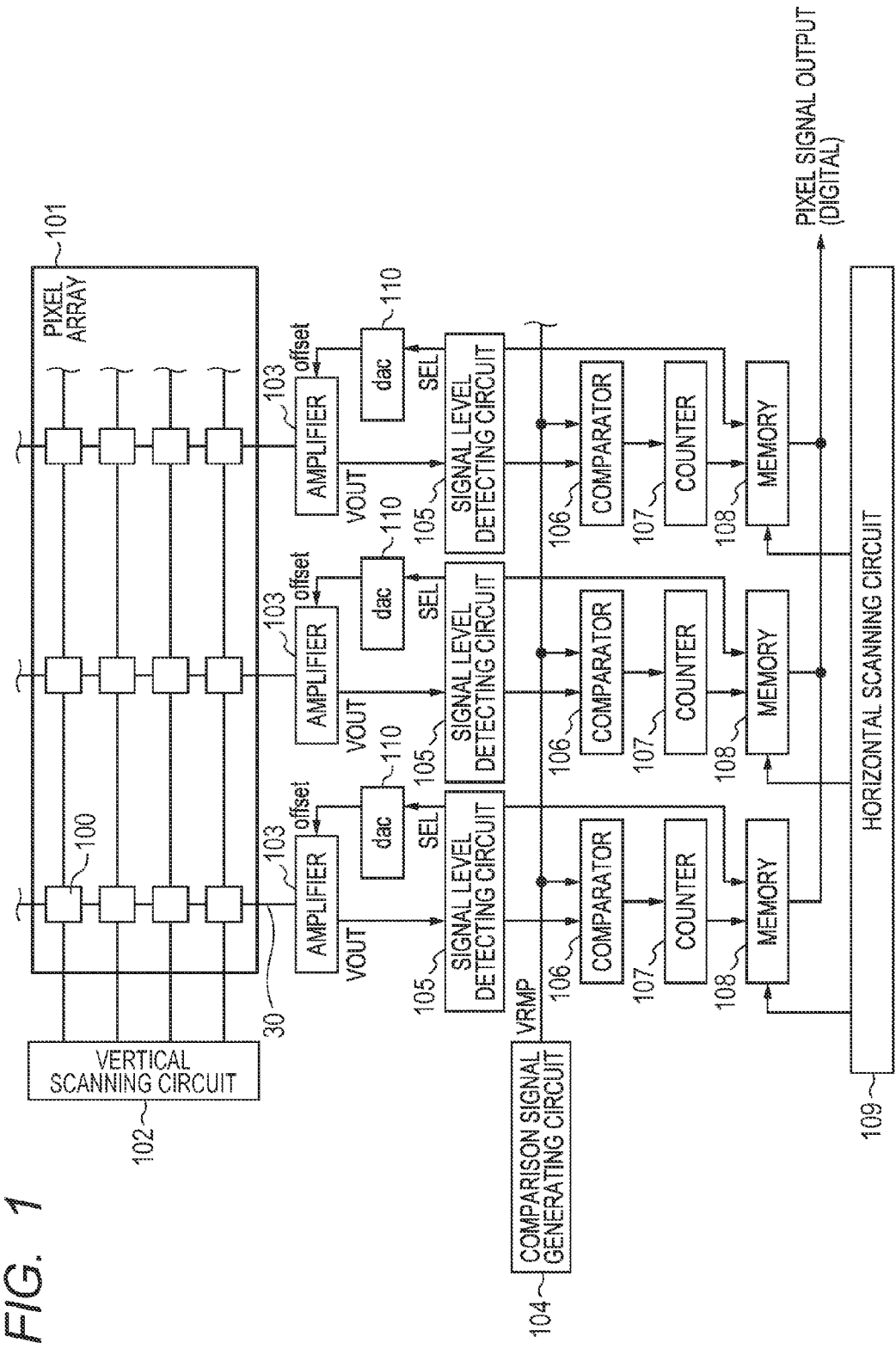
FIG. 1 is a block diagram of a solid-state imaging apparatus according to a first embodiment.

FIG. 1 is a block diagram of a solid-state imaging apparatus according to a first embodiment of the present invention. In FIG. 1, the solid-state imaging apparatus includes a pixel array 101, a vertical scanning circuit 102, amplifiers 103, a comparison signal generating circuit 104, signal level detecting circuits 105, comparators 106, counters 107 and memories 108. The pixel array 101 is constituted by a plurality of pixels 100 that are arranged in a matrix shape having m rows×n columns, in which the pixels 100 of each column of the pixel array are connected to vertical signal lines 30, respectively. The vertical scanning circuit 102 is constituted by a decoder or a shift register or the like, and scans the pixel array 101 in row units. Image signals from the pixel array 101 are read out as required from each row by the vertical scanning circuit 102, and the signals that are read out are output to the amplifiers 103 through the vertical signal lines 30.

The amplifiers 103 that serve as output units are column amplifiers that are constituted by inverting amplifiers, and amplify the respective signals that are read out from the pixels 100 with a predetermined gain. The amplified signals are input to the signal level detecting circuits 105. Each signal level detecting circuit 105 determines whether or not the level of the signal that is output from the amplifier 103 is within the dynamic range of the amplifier 103, that is, whether or not output signal level is out of a range in which A/D conversion is possible. In addition to detecting the output signal level, it is desirable that the signal level detecting circuit 105 also has a function of limiting (clipping) the output so that the output signal level does not deviate significantly from the dynamic range. A detection reference voltage for the output signal level is set to a voltage at a saturation signal level of the amplifier 103 or to a voltage that is close to the saturation signal level.

If the signal level detecting circuit 105 detects that the output signal level is outside the dynamic range, the signal level detecting circuit 105 controls a D/A converter (dac) 110 to change an offset level to be applied to the amplifier 103. After repeating the aforementioned detection one or more times, the signal level detecting circuit 105 stores the detection result in the corresponding memory 108. The signal level detecting circuit 105 and the dac 110 function as an offset addition unit that adds an offset to a pixel signal that is an analog signal. The comparison signal generating circuit 104, the respective comparators 106, and the respective counters 107 constitute a slope-type A/D conversion unit in which a ramp signal is used as a comparison signal. Each comparator 106 compares an output VOUT of the corresponding amplifier 103 and a comparison signal VRMP that the comparison signal generating circuit 104 generates. A/D conversion of the output VOUT is sequentially performed by controlling the corresponding counter 107 in accordance with the result of the comparison. The results obtained by performing the A/D conversion are stored in the memories 108 as digital signals, and are read out in sequence by a horizontal scanning circuit 109.

Figure 2:
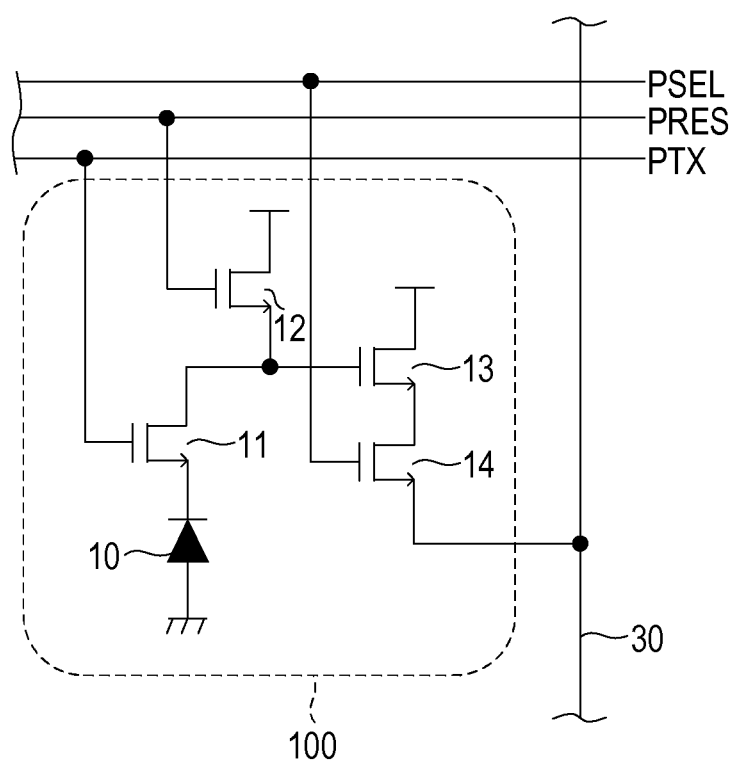
FIG. 2 is a configuration diagram of a pixel according to the first embodiment.

FIG. 2 is a configuration diagram of the pixel 100. The pixel 100 includes a photodiode 10, a transfer transistor 11, a reset transistor 12, an amplification transistor 13 and a selection transistor 14. A signal PTX is applied to the gate electrode of the transfer transistor 11, a signal PRES is applied to the gate electrode of the reset transistor 12, and a signal PSEL is applied to the gate electrode of the selection transistor 14. When the signal PTX is "low" level, a photocharge is accumulated in the photodiode 10, and the photocharge is transferred to the gate electrode of the amplification transistor 13 upon the signal PTX being made "high" level. The photocharge is converted to a voltage by the electrostatic capacity of a gate electrode portion of the amplification transistor 13, that is, a floating diffusion (FD) portion, and the output voltages of the respective amplification transistors 13 of a row selected by switching on the respective selection transistors 14 are output to the respective amplifiers 103 through the vertical signal lines 30 as pixel signals.

Hereunder, mainly the amplifier 103, the dac 110 and the signal level detecting circuit 105 are described in detail.

Figure 3:
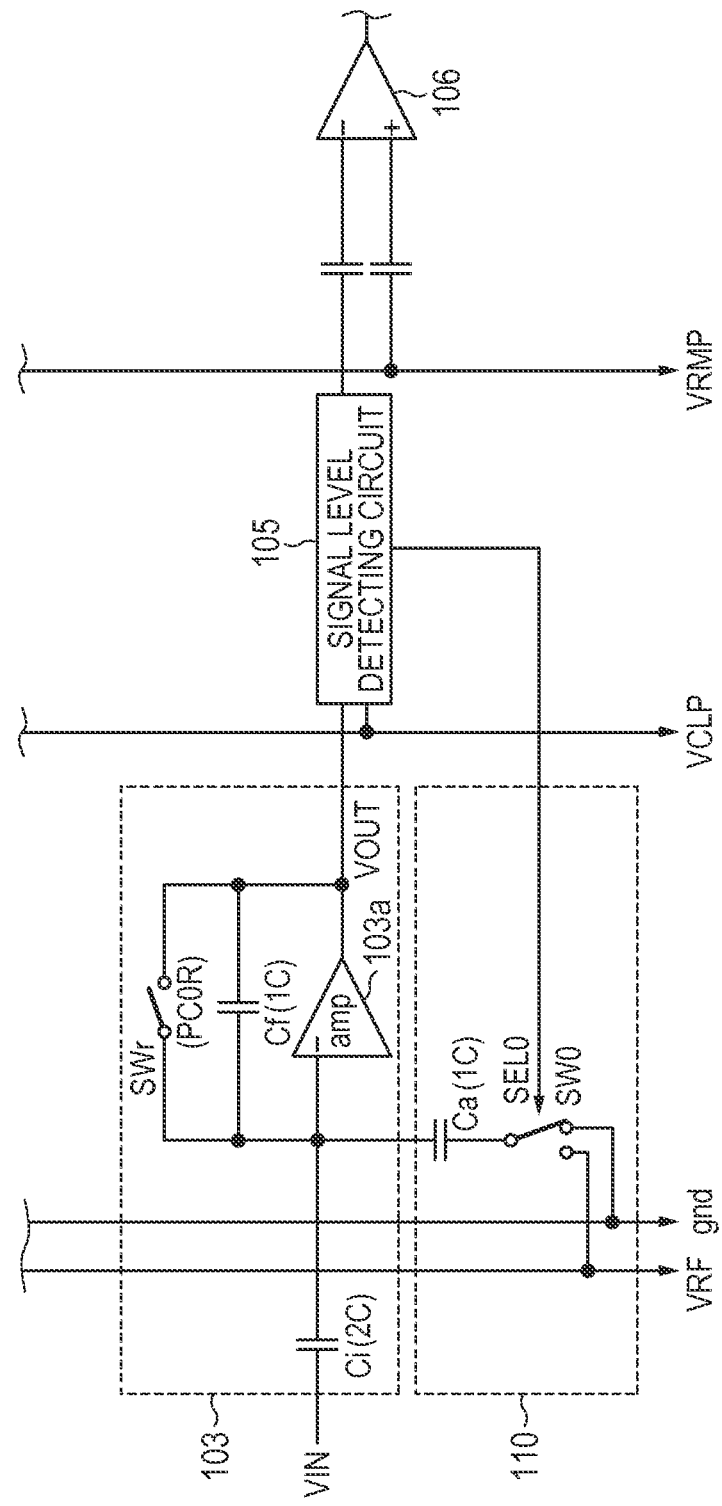
FIG. 3 is a block diagram of an amplifier and a signal level detecting circuit according to the first embodiment.

FIG. 3 is a circuit diagram of the amplifier 103, the dac 110, the signal level detecting circuit 105 and the comparator 106 according to the present exemplary embodiment. The amplifier 103 is constituted by an inverting amplifier 103a, a reset switch SWr that connects the input and output of the inverting amplifier 103a, an input capacitance Ci, and a feedback capacitance Cf. In FIG. 3, an electrostatic capacity value of the input capacitance Ci is denoted by 2C and an electrostatic capacity value of the feedback capacitance Cf is denoted by 1C. Note that, 2C and 1C represent relative electrostatic capacity values, and indicate that the electrostatic capacity value of the input capacitance Ci is a value that is double the value of the electrostatic capacity value of the feedback capacitance Cf. Accordingly, the amplifier 103 outputs a signal VOUT obtained by approximately doubling an input signal VIN.

The dac 110 includes a capacitance Ca and a switch SW0 that can be switched by a signal SEL0, and constitutes a 1-bit D/A converter. The electrostatic capacity value of the capacitance Ca is the same as the electrostatic capacity value of the feedback capacitance Cf. One of the terminals of the capacitance Ca is connected to the input of the inverting amplifier 103a, and the other terminal thereof is switchably connected to a reference voltage VRF or a ground voltage gnd through the switch SW0. The reference voltage VRF is a voltage that controls an offset value applied to the amplifier 103, and is set to a higher voltage than the ground voltage gnd. If the signal SEL0 is "low" level, the ground voltage gnd is applied to the capacitance Ca, while if the signal SEL0 is "high" level, the reference voltage VRF is applied to the capacitance Ca. When the reference voltage VRF that is higher than the ground voltage is applied to the capacitance Ca, the output VOUT of the inverting amplifier 103a decreases by an amount corresponding to the offset voltage (in this case a VRF voltage) that is based on the reference voltage VRF.

The signal level detecting circuit 105 performs a signal level detection based on a signal VCLP that is a detection reference voltage. That is, the signal level detecting circuit 105 compares the output VOUT of the amplifier 103 and a threshold value that is based on the signal VCLP (detection reference voltage), and then outputs the signal SEL0 in accordance with the comparison result. If the output VOUT does not exceed an upper limit level (threshold value), the signal level detecting circuit 105 controls the signal SEL0 to "low" level and applies the ground voltage gnd to the capacitance Ca. On the other hand, if the output VOUT exceeds the threshold value, the signal level detecting circuit 105 controls the signal SEL0 to "high" level and applies the reference voltage VRF to the capacitance Ca. The upper limit level is a voltage of the output VOUT (analog signal) corresponding to a maximum value of a digital signal obtained as a result of performing A/D conversion. Thus, in a case where the output VOUT is close to the saturation level, the output voltage of the output VOUT can be lowered to prevent saturation of the output VOUT. The comparator 106 compares the respective magnitudes of the comparison signal VRMP and the output VOUT of the amplifier 103. The counter 107 counts the time until the comparison signal VRMP exceeds the output VOUT, and the memory 108 stores the count value as an A/D conversion result.

Figure 4:
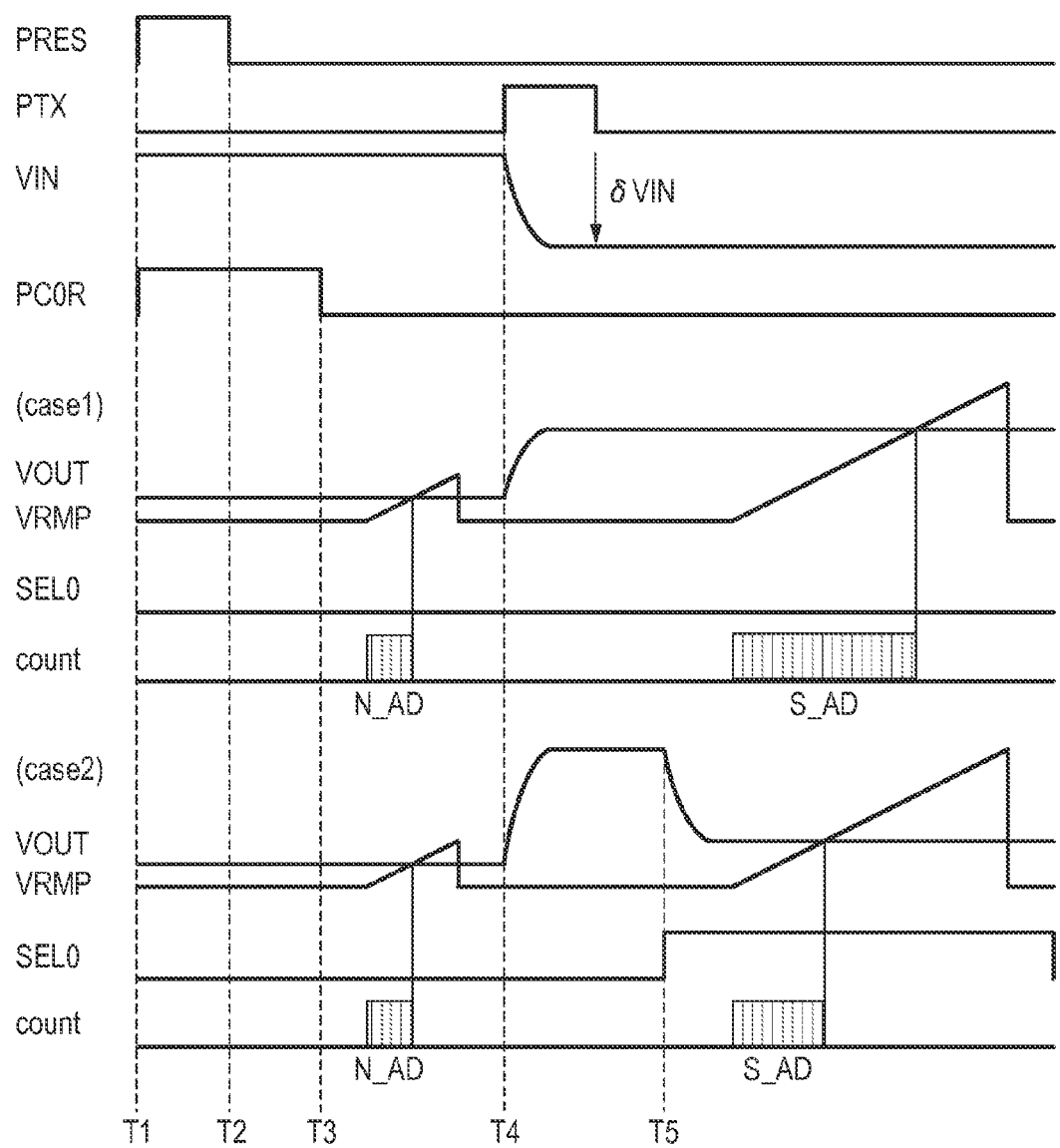
FIG. 4 is a timing chart that illustrates operations according to the first embodiment.

Next, operations of the solid-state imaging apparatus according to the present exemplary embodiment will be described while referring to timing charts illustrated in FIG. 4. In FIG. 4, case 1 and case 2 denote two timing charts in which the signal levels of a pixel are different to each other. Here, an example will be described in which a light amount in case 1 is less than a light amount in case 2.

First, at a time T1, the signal PSEL becomes "high" level and the selection transistor 14 of the pixel 100 switches on. Next, the signal PRES becomes "high" level, the reset transistor 12 switches on, and the floating diffusion portion (FD) is reset. Simultaneously with the signal PRES becoming "high" level, a signal PCOR becomes "high" level, the reset switch SWr of the inverting amplifier 103a switches on, and the feedback capacitance Cf is reset.

Next, the signal PRES becomes "low" level at a time T2, and the signal PCOR becomes "low" level at a time T3. At such time, because the signal SEL0 is at "low" level, a ground voltage is applied to the capacitance Ca. In a state in which a signal at the reset level is being output from the pixel 100, the amplifier 103 inversely amplifies the input signal VIN that is at the reset level and outputs VOUT. A first A/D conversion operation is performed with respect to the output VOUT, and this period is represented as N_AD in FIG. 4. The counter 107 obtains an A/D conversion code by measuring (counting) a time until the magnitude relation between the signal VOUT and the comparison signal VRMP inverts. The operations described up to this point are the same for both case 1 and case 2.

At a time T4, when the signal PTX becoming "high" level the transfer transistor 11 switches on, and a signal that is dependent on the incident light amount is read out from the photodiode 10. In accompaniment therewith, the output VOUT of the amplifier 103 rises. The amount of change in the signal for the input VIN of the amplifier 103 is represented by δVIN which is obtained by excluding the reset level that is a DC component of the signal.

First, in a case where the signal level of the pixel is low and the amplifier 103 does not saturate (case 1), a second A/D conversion is performed similarly to the first A/D conversion N_AD while the signal SEL0 remains at "low" level. In FIG. 4, the second A/D conversion is represented as S_AD. One bit of the signal SEL0 is added to a most significant bit MSB of the count value of the second A/D conversion S_AD. In case 1, because the signal SEL0 is at "low" level, the code "0" is added to the most significant bit MSB of S_AD. Note that, digital CDS (correlated double sampling) that subtracts the code of N_AD from the code of S_AD is performed in the imaging apparatus.

On the other hand, in a case where the signal level of the pixel is high (case 2), the output VOUT of the amplifier 103 saturates (T4 to T5). At the time T5, the signal level detecting circuit 105 detects that the output VOUT has exceeded an upper limit level that is based on the level of the signal VCLP, and feeds back the signal SEL0 that is at "high" level to the amplifier 103. As a result of this feedback, the switch SW0 switches, and the terminal voltage of the capacitance Ca changes from the ground voltage gnd to the reference voltage VRF. As a result, an amount corresponding to an offset level that is based on the reference voltage VRF is subtracted from the output VOUT of the amplifier 103. The second A/D conversion S_AD is performed with respect to the resulting output VOUT. That is, the counter 107 counts a time period until the magnitude relation between the signal VOUT and the comparison signal (ramp signal) VRMP inverts, and thus obtains the code for S_AD. One bit of the signal SEL0 is added to the most significant bit MSB of the count value for S_AD. In case 2, because the signal SEL0 is at "high" level, the code "1" is added to the most significant bit MSB of S_AD. The A/D conversion code obtained in this manner is stored in the memory 108.

Figure 5:
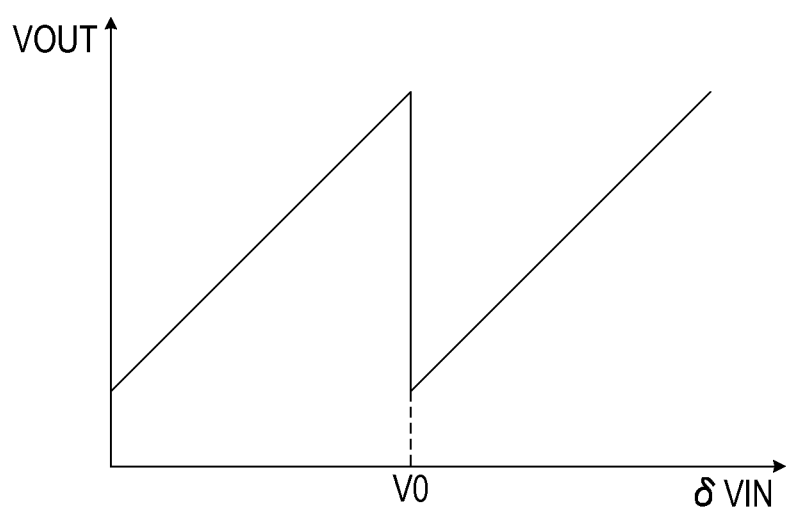
FIG. 5 is a view that illustrates input-output characteristics of the amplifier according to the first embodiment.

FIG. 5 illustrates input-output characteristics of the amplifier 103 with respect to the operations described in FIG. 4. The abscissa axis represents δVIN that is obtained by subtracting the reset level from the input signal VIN. The ordinate axis represents the output VOUT. When δVIN exceeds an upper limit level (threshold value) V0 that is based on the reference voltage VCLP, the reference voltage VRF is applied to the capacitance Ca and an amount corresponding to the offset voltage is subtracted from the output VOUT. Thus, saturation of the pixel signal at the amplifier 103 is prevented, and it is possible to realize characteristics such that the dynamic range is expanded at the amplifier 103.

Figure 6:
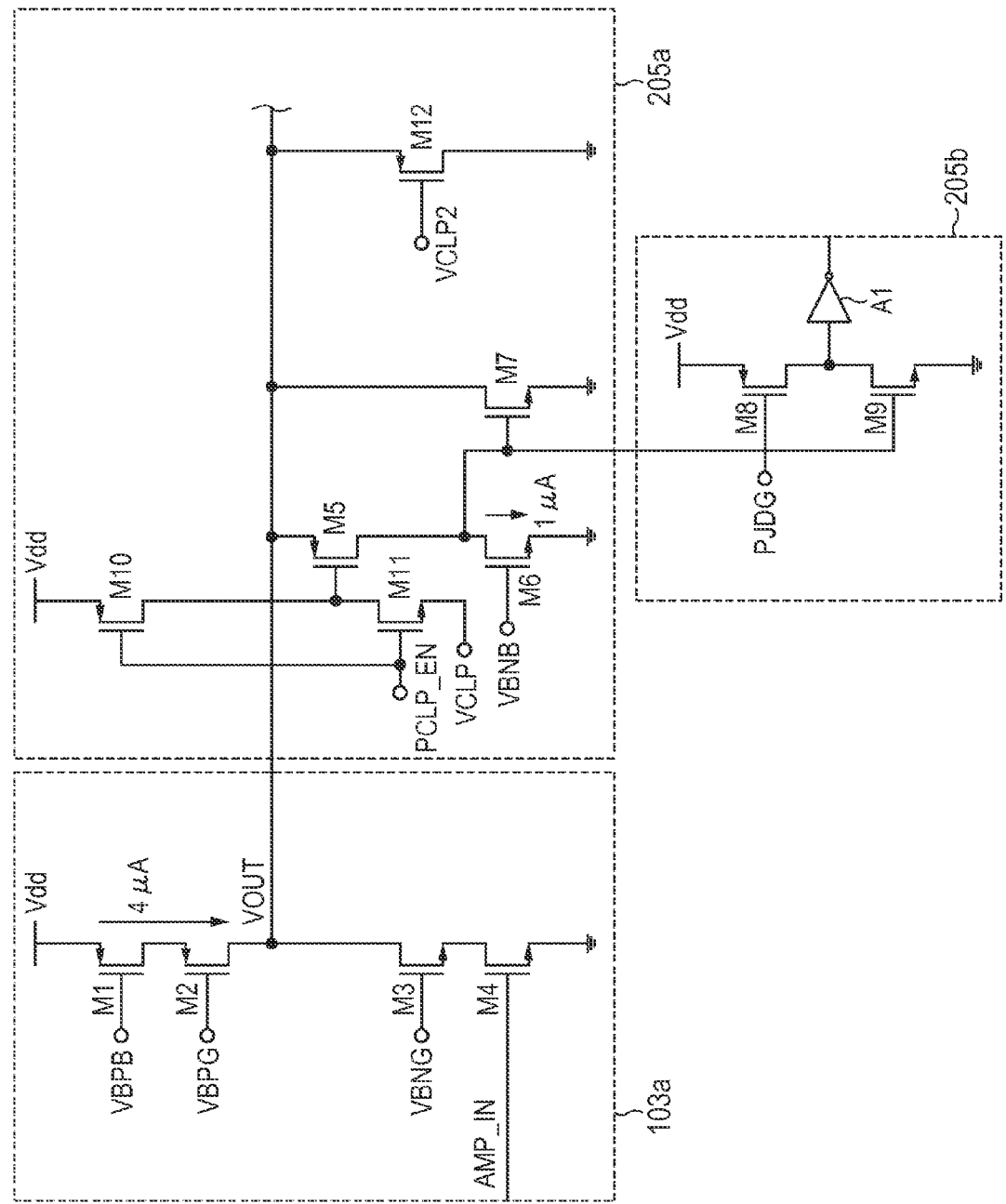
FIG. 6 is a view that illustrates an amplifier and a clip circuit according to the first embodiment.

FIG. 6 illustrates a circuit example of the inverting amplifier 103a and the signal level detecting circuit 105. The signal level detecting circuit 105 includes a clip circuit 205a and a detection output unit 205b. The detection output unit 205b detects the output level of the amplifier 103. The clip circuit 205a limits (clips) the output so that the output level is not out of the dynamic range of the amplifier 103 and saturate or so that the output does not deviate significantly. The inverting amplifier 103a includes transistors M1 to M4, and constitutes an NMOS source-grounded amplifier circuit. The input is denoted by AMP_IN that is a single input, and the output is denoted by VOUT. The transistor M4 is a source-grounded NMOS amplification transistor, the transistor M3 is a gate-grounded NMOS transistor, and the transistors M1 and M2 are constant-current load PMOS transistors that are connected in cascade and, for example, supply a constant current of 4 μA. Voltages VBPB, VBPG and VBNG are DC bias voltages that determine respective operating points.

The clip circuit 205a includes a PMOS transistor M5 for clipping, and a signal VCLP that is the gate voltage determines a threshold value as an output limit. A transistor M6 is an NMOS transistor that supplies a constant current of, for example, 1 μA when the transistor M5 is switched on. An operating point of the transistor M6 is determined by a DC bias voltage VBNB. An NMOS transistor M11 functions as a switch for enabling the clipping transistor M5. Further, a PMOS transistor M10 connects the gate voltage of the clip transistor M5 to Vdd, and functions as a switch for disabling the clip transistor M5. That is, when a signal PCLP_EN is at "low" level, the transistor M10 switches on and the transistor M11 switches off, and the clip transistor M5 is disabled. On the other hand, when the signal PCLP_EN is at "high" level, the transistor M10 switches off, the transistor M11 switches on, and the clip transistor M5 is enabled.

Hereunder, a clipping operation of the clip circuit 205a will be described. If the output VOUT of the inverting amplifier 103a is low, the clip transistor M5 is in an "off" state. Since the transistor M6 is in an "on" state, the gate voltage of the transistor M7 is approximately gnd level and the transistor M7 is an "off" state. Since both the clip transistor M5 and the transistor M7 are in an "off" state, the clip circuit 205a exerts almost no influence on the output VOUT.

On the other hand, if a high luminance signal is input and the output VOUT consequently rises and exceeds the upper limit level (threshold value) that is determined by the signal VCLP, the clip transistor M5 enters an "on" state. At the same time, the gate voltage of the transistor M7 also rises, and thus both the clip transistor M5 and the transistor M7 enter an "on" state. As a result, currents from the transistors M1 and M2 that are load current sources of the inverting amplifier 103a also flow to the clip circuit 205a, and the output VOUT of the inverting amplifier 103a is limited to a predetermined level. Accordingly, the output VOUT enters a clipped state, and it is possible to limit the output VOUT. A transistor M12 is a PMOS clip transistor for implementing a second output limitation, and the threshold value for the output limitation is determined by a signal VCLP2 that is the gate voltage. However, it is assumed that the relation that the signal VCLP2>the signal VCLP holds true.

The detection output unit 205b is constituted by a two-stage inverter circuit, and detects a fact that the gate voltage of the transistor M7 has risen, and outputs a signal indicating that output limitation is active. The first-stage inverter is constituted by a PMOS transistor M8 and an NMOS transistor M9. The transistor M9 is source-grounded. The transistor M8 determines a timing of the detection output based on a signal PJDG that is the gate voltage. The output of the first stage is inverted by a second-stage inverter A1 and output.

Figure 7:
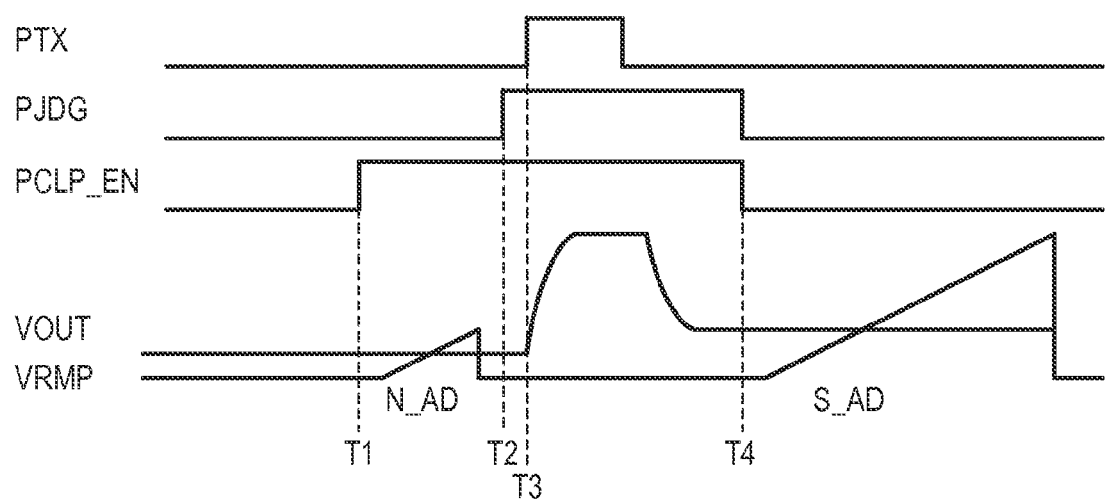
FIG. 7 is a timing chart that illustrates operations of the amplifier and the clip circuit according to the first embodiment.

Hereunder, the operations of the circuit shown in FIG. 6 will be described while referring to the timing chart in FIG. 7. First, at a time T1, the signal PCLP_EN is controlled to "high" level so that the clip transistor M5 is enabled until a light signal is input. As a result, the signal VCLP is applied to the gate voltage of the clip transistor M5. In this case, although the clip transistors M5 and M12 are both enabled, the signal VCLP2>the signal VCLP. Consequently, the clip transistor M5 switches on prior to the clip transistor M12 and limits the output VOUT. The signal PJDG becomes "high" level at a time T2 that is before the signal PTX becomes "high" level. By this means, the output of the inverter constituted by the transistors M8 and M9 becomes a high impedance output, and the output is held at "high" level by a parasitic capacitance. At a time T3, when the signal PTX becomes "high" level and a high luminance signal is input, the clip transistor M5 switches on and the gate voltage of the transistors M7 and M9 rises. Consequently, the output of the inverter constituted by the transistors M8 and M9 inverts from "high" level to "low" level. Based on this signal, the signal level detecting circuit 105 inverts the signal SEL0 to "high" level. Subsequently, before the start of the second A/D conversion S_AD, at a time T4, the signals PCLP_EN and PJDG become "low" level and the clip transistor M5 switches off. Further, the detection output unit 205b enters a non-operating state, and only the clip transistor M12 is enabled. In a case where the output VOUT is slightly lower than the threshold value voltage of the clip transistor M5, the clip transistor M5 is in a state of sub-threshold operation, and does not switch completely off. Consequently, in some cases an error arises in the output VOUT of the inverting amplifier 103a. Therefore, in the present exemplary embodiment, by providing the second clip transistor M12, an error that is caused by sub-threshold operation of the clip transistor M5 can be avoided. Thus, the second A/D conversion S_AD is executed in a state in which an error does not arise.

Second Embodiment

Figure 8:
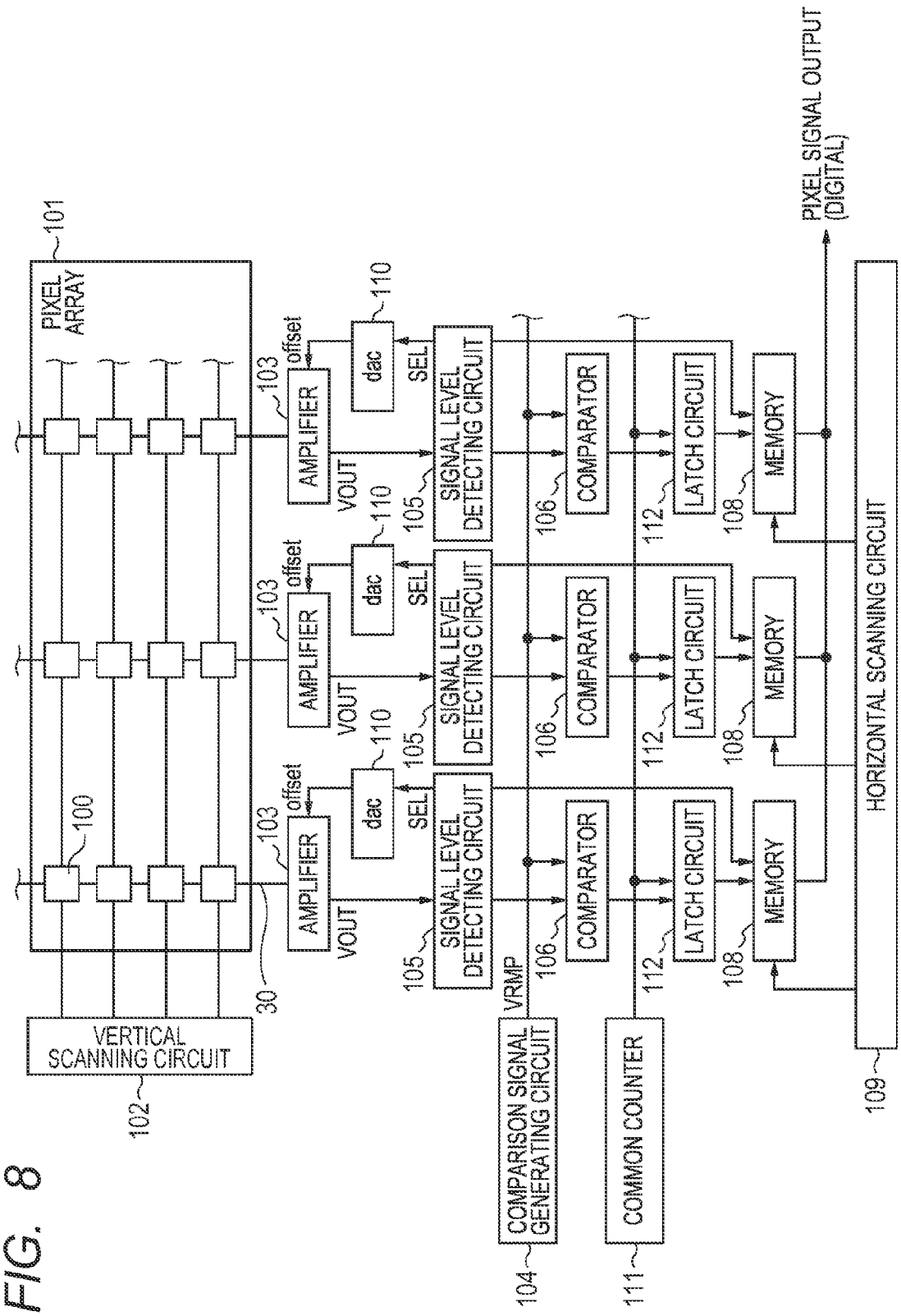
FIG. 8 is a block diagram of a solid-state imaging apparatus according to a second embodiment.

FIG. 8 is a block diagram of a circuit of a solid-state imaging apparatus according to a second embodiment of the present invention. Although in the first embodiment the counter 107 is provided for each column circuit, in the present exemplary embodiment a single common counter 111 is shared by the respective column circuits. A latch circuit 112 is provided for each column, and holds the count value of the common counter 111. One bit of the signal SEL0 is added to the most significant bit MSB of the count value that is held in the latch circuit 112, and the resulting value is stored in the memory 108. The remaining configuration is the same as the configuration according to the first embodiment, and hence a description thereof is omitted here.

Third Embodiment

Figure 9:
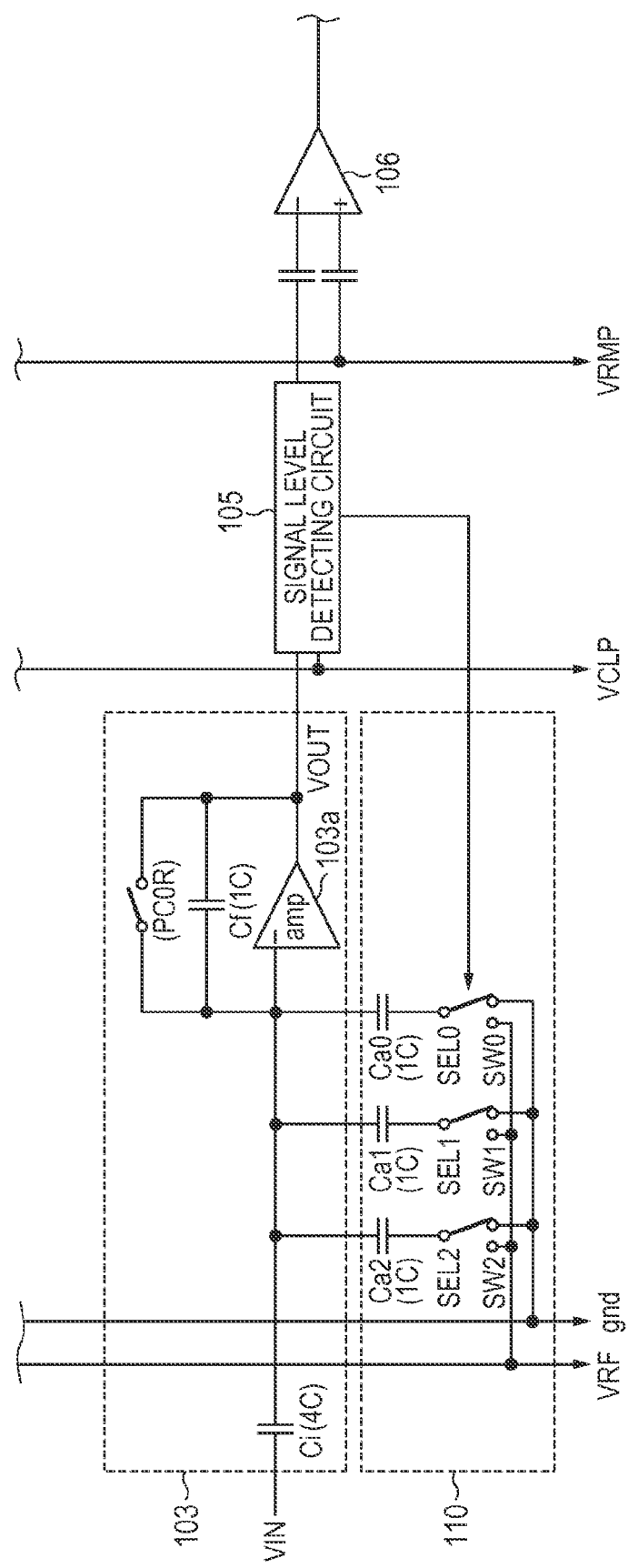
FIG. 9 is a block diagram of an amplifier and a signal level detecting circuit according to a third embodiment.

FIG. 9 is a circuit diagram of the amplifier 103, the dac 110, the signal level detecting circuit 105 and the comparator 106 according to a third embodiment of the present invention. The present exemplary embodiment differs from the configuration shown in FIG. 3 in the respect that the dac 110 is a 2-bit D/A converter, the dac 110 has three capacitances Ca0 to Ca2, and the electrostatic capacity value of the input capacitance Ci is 4C. Since the electrostatic capacity of the input capacitance Ci is 4C and the electrostatic capacity of the feedback capacitance Cf is 1C, the gain of the amplifier 103 is approximately 4 times. The dac 110 is a 2-bit D/A converter, signals SEL0 to SEL2 are assigned to thermometer code, and the thermometer code is encoded into 2-bit straight binary code. An encoder of the thermometer code can be appropriately provided in the signal level detecting circuit 105 or the memory 108 or the like. The 2-bit binary code encoded in this manner is added to the most significant bit MSB of the count value, and the code is thus defined.

Next, operations of the solid-state imaging apparatus according to the present exemplary embodiment will be described while referring to the timing chart in FIG. 10. The operations in a case where the signal level of the pixel is low (case 1) are almost the same as the operations illustrated in FIG. 4. In case 1, since the output VOUT is equal to or less than an upper limit level that is based on the signal VCLP, the signal level detecting circuit 105 outputs the signals SEL0 to SEL2 that are at "low" level. The voltage applied to each of the capacitances Ca0 to Ca2 is the ground voltage. In this state, signals that are at reset level are read out (T1 T3), and the first A/D conversion N_AD is performed with respect to the output VOUT from the amplifier 103. Next, a signal that depends on the incident light amount is read out from the photodiode 10 (T4), and the second A/D conversion S_AD is performed with respect to the output VOUT. In case 1, the thermometer code of the signals SEL0 to SEL2 is "000", and the 2-bit straight binary code "00" is added to the most significant bit of the count value.

In a case where the signal level of the pixel is high (case 2), the first A/D conversion is executed in the same manner as in case 1(T1 to T3, N_AD). At the time T4, when the signal PTX becomes "high" level, the amplifier 103 amplifies the signal VIN that depends on the incident light amount and outputs the signal VOUT. At the time T5, upon detecting that the signal VOUT exceeds the upper limit level that is based on the level of the signal VCLP, the signal level detecting circuit 105 feeds back the signal SEL2 that is "high" level to the amplifier 103. By means of this feedback, the switch SW2 switches, the reference voltage VRF is applied to the capacitance Ca2, and an offset level that is based on the reference voltage VRF is subtracted from the output VOUT. At a time T6, if the output VOUT still exceeds the upper limit level, the signal level detecting circuit 105 feeds back the signal SEL1 that is "high" level to the amplifier 103. At a time T7, if the output VOUT still exceeds the upper limit level, the signal level detecting circuit 105 feeds back the signal SEL0 that is "high" level to the amplifier 103. The reference voltage VRF is applied to the capacitances Ca0 to Ca2, the offset level is subtracted from the output VOUT, and the output VOUT becomes less than or equal to the upper limit level.

Similarly to the operations illustrated in FIG. 4, the second A/D conversion S_AD is performed with respect to the aforementioned output VOUT. Since the signals SEL0 to SEL2 are all "high" level, the thermometer code is "111", and this thermometer code is encoded into the straight binary code "11". The 2-bit code "11" obtained in this manner is added to the most significant bit of the count value, and thus the code is defined.

Figure 10:
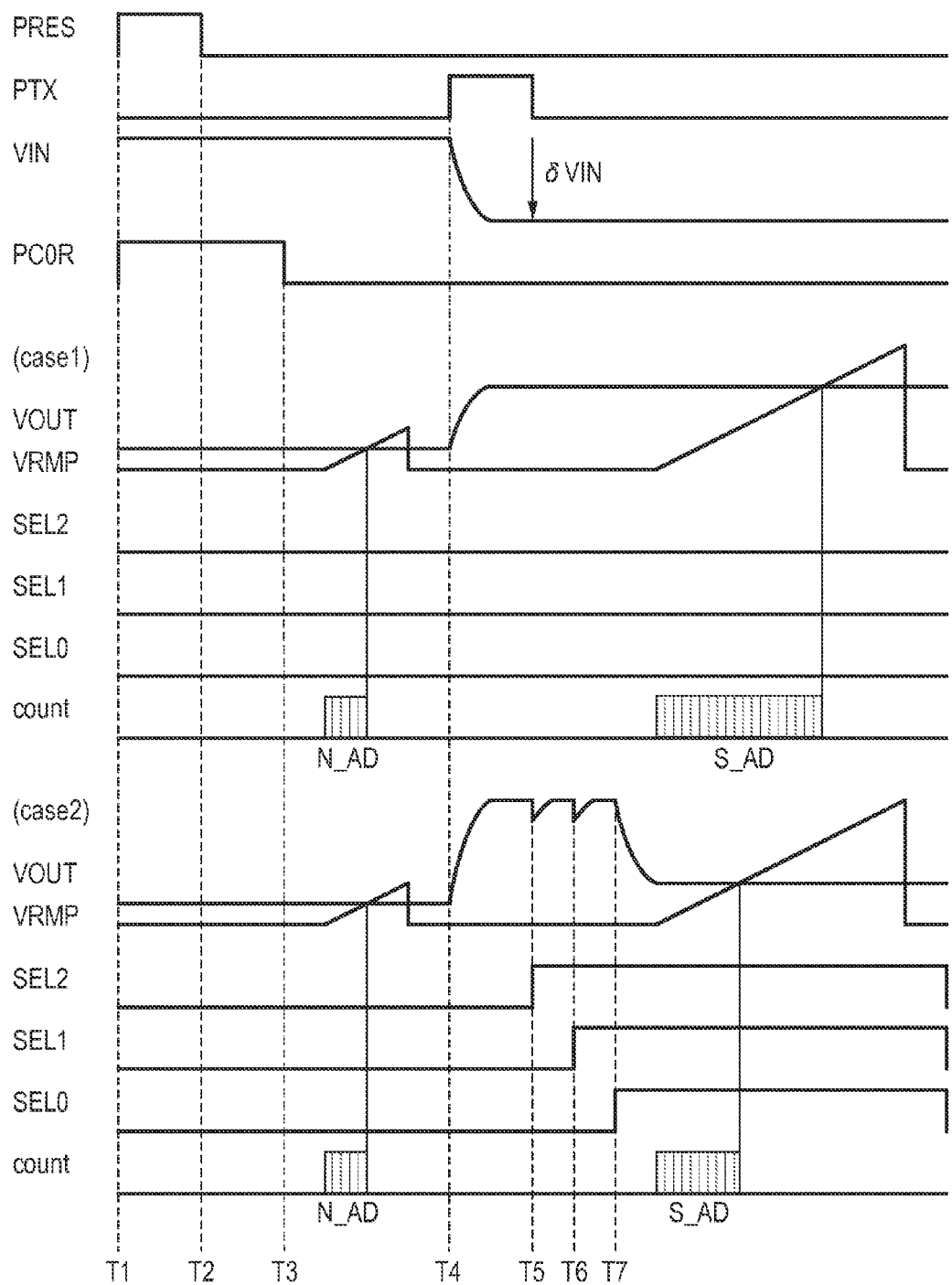
FIG. 10 is a timing chart for describing operations according to the third embodiment.
Figure 11:
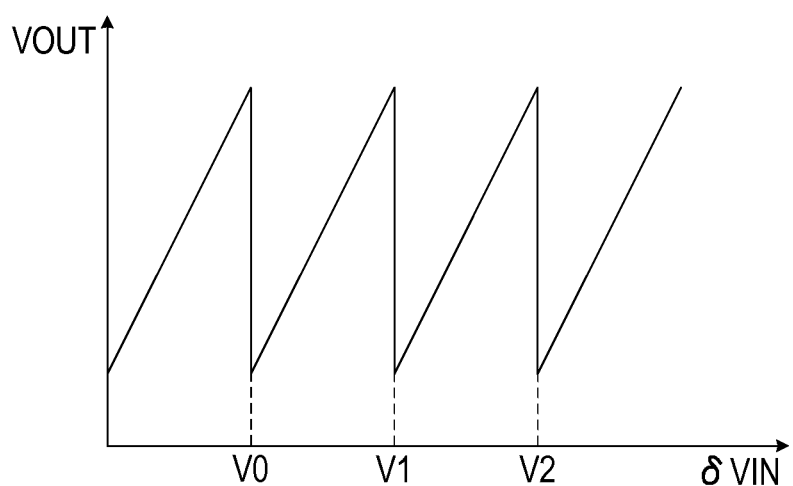
FIG. 11 is a view that illustrates input-output characteristics of the amplifier according to the third embodiment.

FIG. 11 illustrates input-output characteristics of the amplifier 103 with respect to the operations described in FIG. 10. Since the dac 110 in the present exemplary embodiment is a 2-bit D/A converter, characteristics are obtained such that there are three places where the level of the output VOUT turns back. That is, an offset amount is subtracted from the output VOUT each time δVIN exceeds the three threshold values V0, V1 and V2, respectively. According to the present exemplary embodiment, it is possible to further expand the dynamic range of the amplifier 103 in comparison to the first embodiment.

Note that, although in the present exemplary embodiment the resolution of the dac 110 that controls the offset is set as two bits, an arbitrary number of bits (i bits) can be used. Accordingly, a digital code (i bits) representing an offset can be added to the digital code (j bits) after A/D conversion to obtain a digital code of (i+j) bits.

Fourth Embodiment

Figure 12:
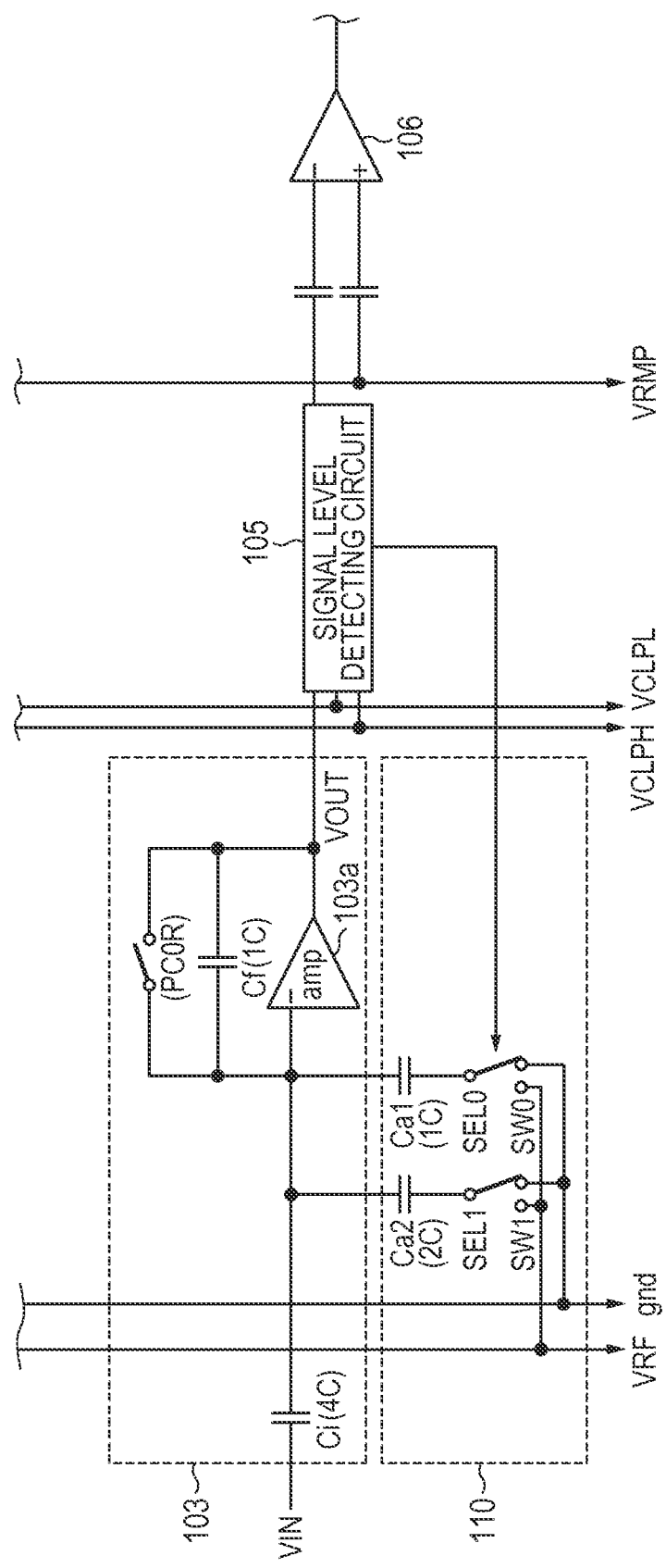
FIG. 12 is a block diagram of an amplifier and a signal detecting circuit according to a fourth embodiment.

FIG. 12 is a circuit diagram of the amplifier 103, the dac 110, the signal level detecting circuit 105, and the comparator 106 according to a fourth embodiment of the present invention. The configuration of the present exemplary embodiment differs from the configuration illustrated in FIG. 9 in the respect that the dac 110 includes two capacitances Ca1 and Ca2 which are weighted. That is, the electrostatic capacity value of the capacitance Ca1 is 1C, and the electrostatic capacity value of the capacitance Ca2 is 2C. Further, the configuration of the present exemplary embodiment differs from the configuration illustrated in FIG. 9 in the respect that the signal level detecting circuit 105 performs a detection with respect to an upper limit level and a lower limit level of the output VOUT. The upper limit level and the lower limit level are voltages of the output VOUT (analog signal) corresponding to a maximum value and a minimum value of digital signals obtained as a result of performing A/D conversion, respectively. The signal level detecting circuit 105 can determine both the upper limit level and the lower limit level of the output VOUT based on a reference voltage VCLPH for the upper limit level and a reference voltage VCLPL for the lower limit level.

Figure 13:
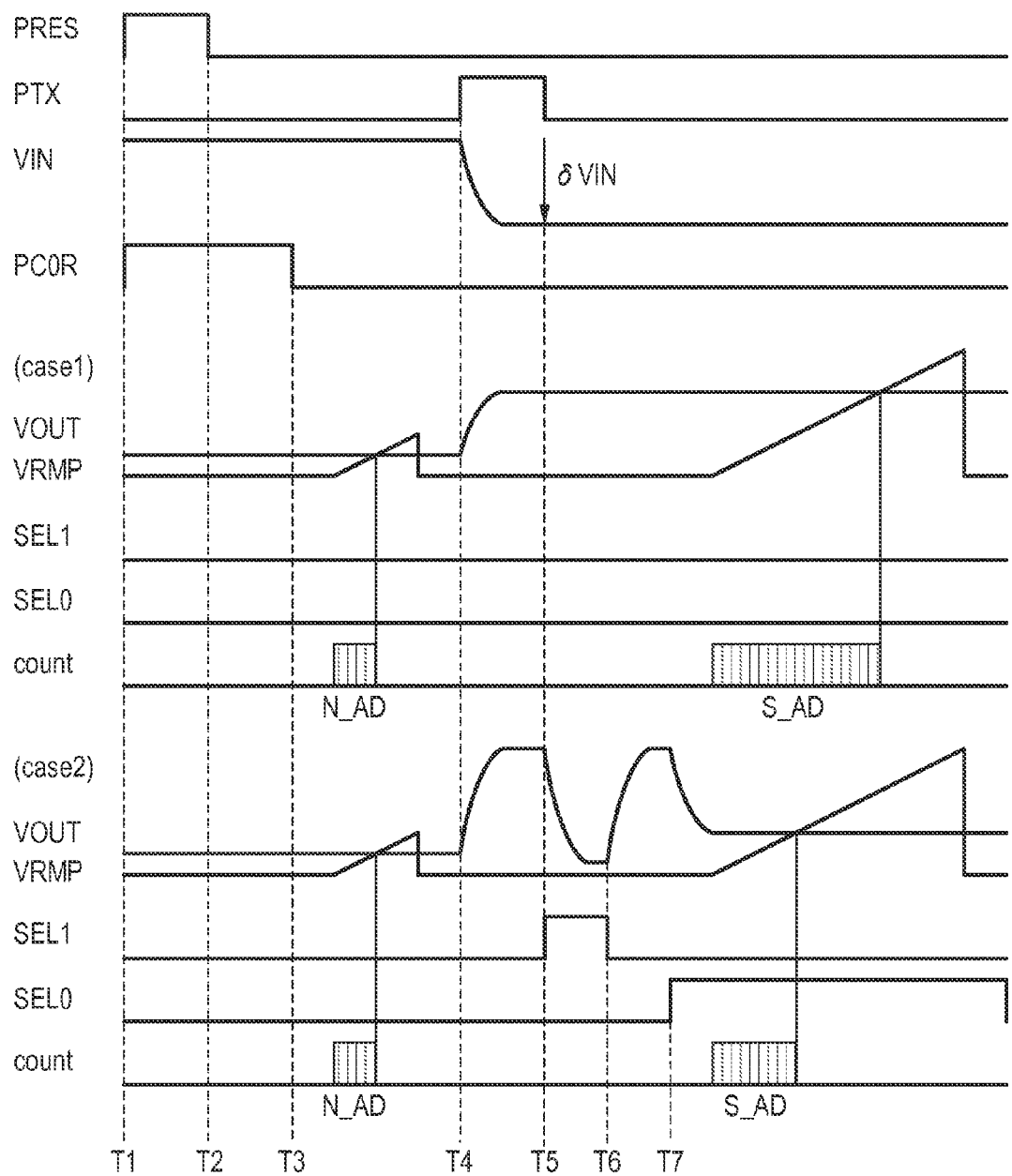
FIG. 13 is a timing chart for describing operations according to the fourth embodiment.

Next, operations of the solid-state imaging apparatus according to the present exemplary embodiment will be described while referring to the timing chart in FIG. 13. The operations in a case where the signal level of the pixel is low (case 1) are almost the same as the operations illustrated in FIG. 4 and FIG. 10. In a case where the signal level of the pixel is high (case 2), the first A/D conversion is executed in the same manner as in case 1(T1 to T3, N_AD). Subsequently, at the time T4, the signal PTX becomes "high" level, and the amplifier 103 amplifies the signal VIN and outputs the signal VOUT. Similarly to the operations illustrated in FIG. 4 and FIG. 10, at the time T5, upon detecting that the output VOUT exceeds the upper limit level that is based on the level of the signal VCLPH, the signal level detecting circuit 105 feeds back the signal SEL1 that is "high" level to the amplifier 103. The reference voltage VRF is applied to the capacitance Ca2, and an offset level that is based on the reference voltage VRF is subtracted from the output VOUT.

Thereafter, at the time T6, upon detecting that the output VOUT has fallen below the lower limit level that is based on the signal VCLPL, the signal level detecting circuit 105 controls the signal SEL1 to "low" level again. At the time T7, the signal level detecting circuit 105 detects that the output VOUT again exceeds the upper limit level, and feeds back the signal SEL0 that is "high" level to the amplifier 103. The reference voltage VRF is applied to the capacitance Ca1, and the offset level is subtracted from the output VOUT. Because the capacitance value of the capacitance Ca1 is half the capacitance value of the capacitance Ca2, an offset level that is based on the capacitance Ca1 is less than an offset level that is based on the capacitance Ca2. Consequently, the output VOUT is within a range between the upper limit level and the lower limit level. The comparator 106 and the counter 107 perform the second A/D conversion S_AD with respect to this output VOUT. In the present exemplary embodiment, the code is defined by adding the signals SEL0 and SEL1 as the most significant two bits to the count value. In the foregoing description, "00" is added to the count value in case 1, and "01" is added to the count value in case 2.

Although in the exemplary embodiment described above, the most significant bits defined by the dac 110 are two bits or less, it is also possible to increase the number of bits of the dac 110 and perform A/D conversion with an even higher resolution.

Fifth Embodiment

Figure 14:
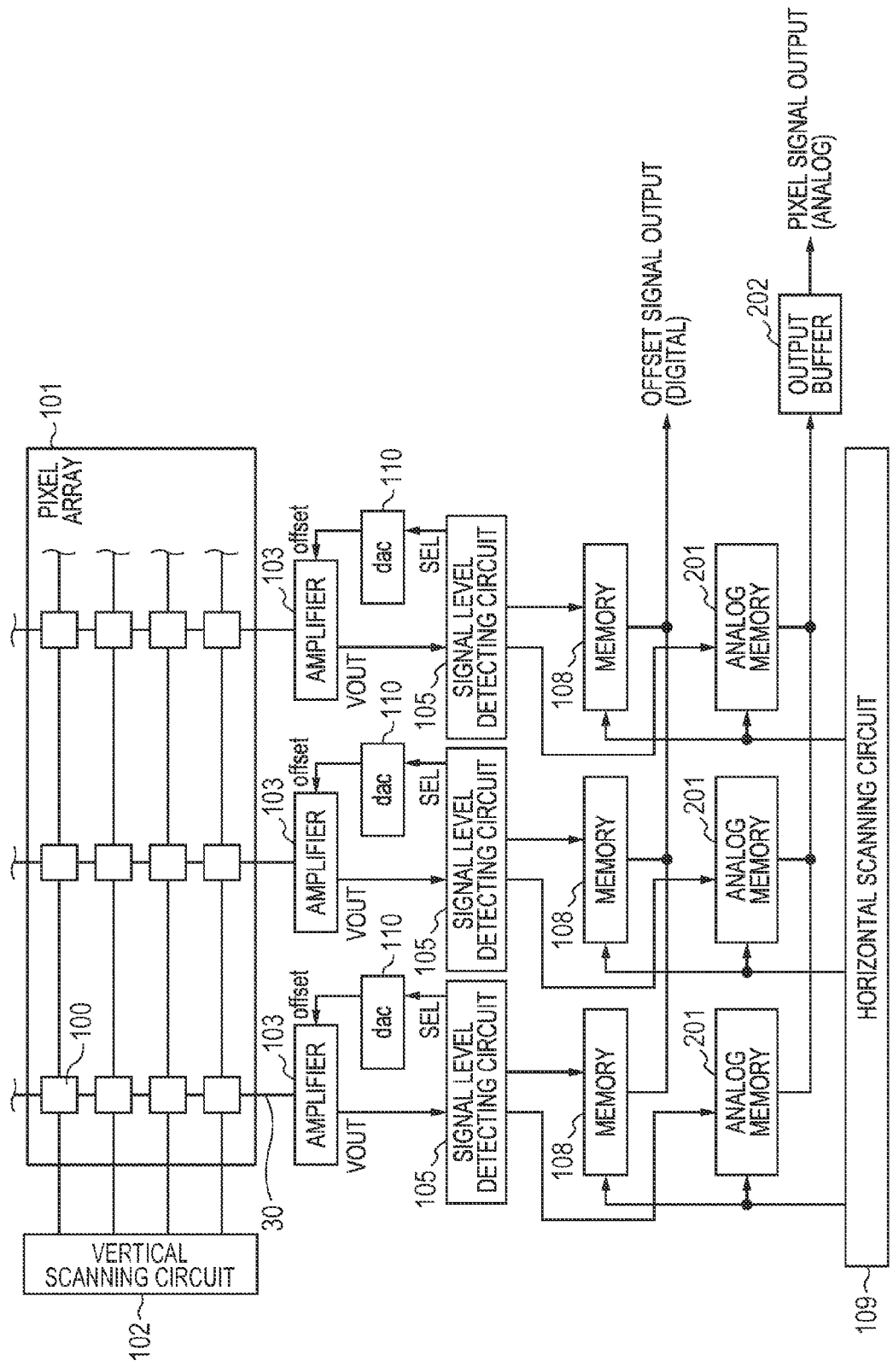
FIG. 14 is a block diagram of a solid-state imaging apparatus according to a fifth embodiment.

FIG. 14 is a circuit block diagram of a solid-state imaging apparatus according to a fifth embodiment of the present invention. Although the solid-state imaging apparatuses shown in FIG. 1 and FIG. 8 output an image signal as a digital signal, in the present exemplary embodiment a digital code that is based on an offset setting, and an analog signal obtained after subtraction of an offset are output together. In FIG. 14, analog memories 201 are constituted by, for example, a sample-and-hold circuit or a floating gate transistor, and the respective amplifiers 103 store the output VOUT as it is as an analog signal. Data that is based on a signal SEL from the respective dacs 110 is stored in the corresponding memories 108 in a similar manner to the configurations illustrated in FIG. 1 and FIG. 8. The analog signals and the corresponding digital codes are sequentially read out by scanning the analog memories 201 and the memories 108 using the horizontal scanning circuit 109. The analog signals that were read out are output as an image signal from an output buffer 202. In an external circuit of the solid-state imaging apparatus, for example, the analog image signal can be decoded by adding or subtracting an amount corresponding to an offset voltage represented by the digital code to or from the image signal by means of an offset circuit. According to the present exemplary embodiment, it is possible to apply the present invention to an image signal in a solid-state imaging apparatus that does not have an A/D conversion circuit.

Sixth Embodiment

Figure 15:
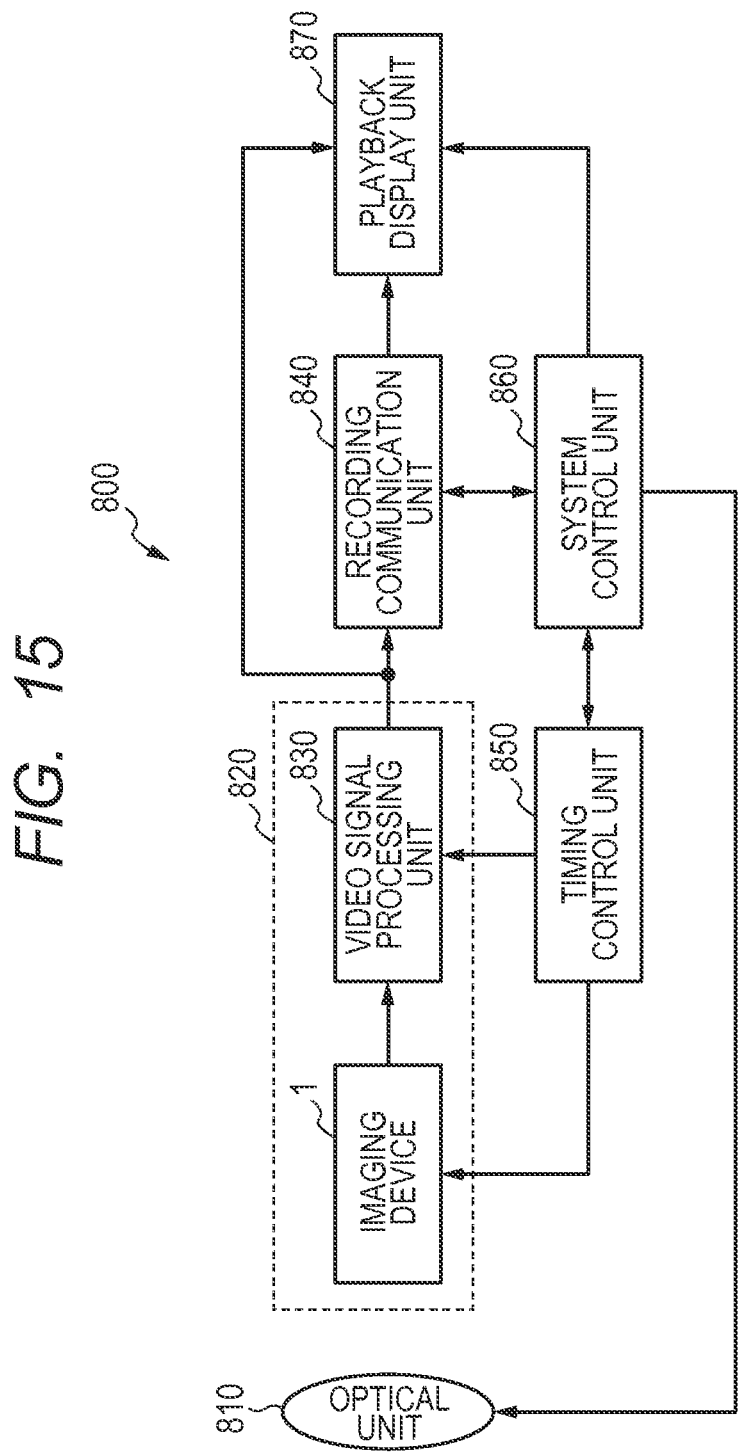
FIG. 15 is a block diagram of a solid-state imaging apparatus system according to a sixth embodiment.

FIG. 15 is a view illustrating a configuration example of an imaging system according to a sixth embodiment of the present invention. An imaging system 800 includes, for example, an optical unit 810, an imaging device 1, a video signal processing unit 830, a recording communication unit 840, a timing control unit 850, a system control unit 860, and a playback display unit 870. An imaging apparatus 820 includes the imaging device 1 and the video signal processing unit 830. An imaging device 1 described in the foregoing exemplary embodiments is used as the imaging device 1. The imaging system can include a digital camera, a video camera, a smartphone or various other apparatuses that have a photographing function.

The optical unit 810 that is an optical system such as a lens causes imaging of light from a subject onto the imaging device 1 in which a plurality of pixels are arrayed in a two-dimensional shape to thereby form an image of the subject. At a timing that is based on a signal from the timing control unit 850, the imaging device 1 outputs a signal in accordance with the light that was imaged on the imaging device 1. The signal that is output from the imaging device 1 is input to the video signal processing unit 830 that is a video signal processing unit, and the video signal processing unit 830 performs signal processing in accordance with a method determined by a program or the like. A signal obtained as a result of the processing at the video signal processing unit 830 is sent to the recording communication unit 840 as image data. The recording communication unit 840 sends a signal for forming an image to the playback display unit 870, and the playback display unit 870 plays back/displays a moving image or a still image. Further, upon receiving the signal from the video signal processing unit 830, the recording communication unit 840 carries out communication with the system control unit 860, and also performs an operation to cause the signal for forming the image to be recorded on an unshown recording medium.

The system control unit 860 carries out unified control of the operations of the imaging system, and controls driving of the optical unit 810, the timing control unit 850, the recording communication unit 840, and the playback display unit 870. The system control unit 860 includes an unshown storage device that is, for example, a recording medium. Programs that are necessary for controlling operations of the imaging system are recorded on the recording medium. The system control unit 860 also supplies signals for switching a drive mode in accordance with, for example, a user operation, into the imaging system. Specific examples of such signals include a signal for changing a row to be read out or a row to be reset, a signal for changing an angle of view accompanying electronic zooming, and a signal for shifting the angle of view accompanying electronic vibration control. The timing control unit 850 controls the drive timing of the imaging device 1 and the video signal processing unit 830 based on control by the system control unit 860.

As described above, according to the present invention, saturation of a pixel signal can be avoided by applying an offset to the pixel signal so that the pixel signal is not out of a range of an input of the A/D converter. By this means it is possible to prevent a decrease in the dynamic range of a large pixel signal in a solid-state imaging apparatus. Note that the present invention is not limited to the exemplary embodiments described above, and appropriate modifications can be implemented without departing from the spirit and scope of the present invention.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-123113, filed Jun. 16, 2014, which is hereby incorporated by reference herein in its entirety.

What is claimed is:

1. A solid-state imaging apparatus, comprising:
an output unit that outputs an analog signal;
an A/D conversion unit including a comparator that generates a comparison result signal by performing a comparison between the analog signal and a ramp signal, and configured to convert the analog signal to a digital signal having plural bits by the comparison, a level of the ramp signal changing from a first level to a second level in a predetermined period;
a counter configured to generate a count value by counting a time during a counting period in the predetermined period, the count value corresponding to the digital signal of the plural bits, the counting period having at least a period between a timing corresponding to starting of changing the level of the ramp signal and a timing corresponding to changing a level of the comparison result signal; and
an offset addition unit that, in a case where it is detected that the analog signal is out of a range in which A/D conversion is possible in the A/D conversion unit, adds an offset having a first value to the analog signal in the output unit so that the analog signal falls within the range,
wherein the output unit outputs the analog signal including the offset having the first value to the comparator during the counting period.

2. The solid-state imaging apparatus according to claim 1, wherein an upper limit level and a lower limit level of the range are values of an analog signal corresponding to a maximum value and a minimum value of a digital signal obtained as a result of performing A/D conversion, respectively.

3. The solid-state imaging apparatus according to claim 2, wherein the A/D conversion unit outputs the digital signal of (i+j) bits in which a digital code of i bits indicating whether the offset is added to the analog signal and a digital code of j bits obtained by converting the analog signal to which the offset is added.

4. The solid-state imaging apparatus according to claim 1, wherein the output unit includes an amplifier, and the analog signal is output via the amplifier.

5. The solid-state imaging apparatus according to claim 2, wherein the offset addition unit has a clip circuit that limits an output of the output unit; and
the upper limit level or the lower limit level is a threshold value at which the clip circuit does not operate.

6. The solid-state imaging apparatus according to claim 1, wherein the offset addition unit has a clip circuit that limits an output of the output unit; and
wherein the offset addition unit adds the offset to the analog signal in a case where the clip circuit operates.

7. The solid-state imaging apparatus according to claim 1, wherein the offset addition unit executes:
a first processing that adds a first offset to the analog signal; and
a second processing that, in a case where the analog signal to which the first offset is added is detected to be out of the range, further adds a second offset to the analog signal to which the first offset is added.

8. The solid-state imaging apparatus according to claim 1, wherein an analog signal that is obtained by adding an offset to the analog signal by means of the offset addition unit, and a digital code of i bits indicating that an offset is added are output together.

9. The solid-state imaging apparatus according to claim 1, wherein the offset addition unit varies the offset added to the analog signal in a case where the analog signal to which the offset is added is out of the range.

10. An imaging system, comprising:
a solid-state imaging apparatus; and
a signal processing unit that generates an image using a signal that the solid-state imaging apparatus outputs,
wherein the solid-state imaging apparatus comprises:
an output unit that outputs an analog signal;
an A/D conversion unit including a comparator that generates a comparison result signal by performing a comparison between the analog signal and a ramp signal, and configured to convert the analog signal to a digital signal having plural bits by the comparison, a level of the ramp signal changing from a first level to a second level in a predetermined period;
a counter configured to generate a count value by counting a time during a counting period in the predetermined period, the count value corresponding to the digital signal of the plural bits, the counting period having at least a period between a timing corresponding to starting of changing the level of the ramp signal and a timing corresponding to changing a level of the comparison result signal; and an offset addition unit that, in a case where it is detected that the analog signal is out of a range in which A/D conversion is possible in the A/D conversion unit, adds an offset having a first value to the analog signal in the output unit so that the analog signal falls within the range, wherein the output unit outputs the analog signal including the offset having the first value to the comparator during the counting period.

11. A solid-state imaging apparatus comprising:

an output unit that outputs an analog signal;

an A/D conversion unit that converts the analog signal to a digital signal;

an offset addition unit that, in a case where it is detected that the analog signal is out of a range in which A/D conversion is possible in the A/D conversion unit, adds an offset to the analog signal in the output unit so that the analog signal falls within the range; and a signal detecting circuit that detects that the analog signal to which an offset is added is out of the range in which A/D conversion is possible in the A/D conversion unit, wherein the offset addition unit varies the offset added to the analog signal in the output unit in a case where the signal detecting circuit detects that the analog signal to which an offset is added is out of the range.

* * * * *